United States Patent [19]

Itoh

[11] Patent Number: 5,434,772

[45] Date of Patent: Jul. 18, 1995

[54] CONTROL DEVICE FOR THYRISTOR CONVERTER

[75] Inventor: Katsuro Itoh, Tokyo, Japan

[73] Assignee: Kabushiki Kaisha Toshiba, Kawasaki, Japan

[21] Appl. No.: 217,022

[22] Filed: Mar. 24, 1994

Related U.S. Application Data

[63] Continuation of Ser. No. 53,404, Apr. 28, 1993, abandoned.

[30] Foreign Application Priority Data

Jun. 15, 1992 [JP] Japan .................................. 4-154598

[51] Int. Cl.⁶ ............................................. H02M 3/24
[52] U.S. Cl. ........................................ 363/96; 363/57
[58] Field of Search ....................... 363/54, 57, 58, 85, 363/96, 135, 136; 307/644, 646

[56] References Cited

U.S. PATENT DOCUMENTS

| | | | |
|---|---|---|---|
| 4,672,520 | 6/1987 | Ueda et al. | 363/54 |
| 4,785,388 | 11/1988 | Takahashi | 363/68 |
| 4,796,146 | 1/1989 | Takahashi | 363/57 |
| 4,859,884 | 8/1989 | Yoshino | 307/646 |
| 4,947,282 | 8/1990 | Kobayashi | 361/91 |
| 5,115,156 | 5/1992 | Tsui | 307/638 |
| 5,155,673 | 10/1992 | Takahashi et al. | 363/54 |

FOREIGN PATENT DOCUMENTS

| | | | |
|---|---|---|---|
| 0162944 | 12/1985 | European Pat. Off. | H02M 1/08 |
| 0458511 | 11/1991 | European Pat. Off. | H02M 1/092 |
| 346974 | 11/1976 | Germany | H02H 7/10 |
| 56-53572 | 5/1981 | Japan | H02M 1/08 |
| 2145583 | 3/1985 | United Kingdom | H02M 1/08 |

Primary Examiner—Thomas M. Dougherty
Assistant Examiner—Matthew V. Nguyen
Attorney, Agent, or Firm—Oblon, Spivak, McClelland, Maier, & Neustadt

[57] ABSTRACT

A device for controlling a thyristor converter including series connected thyristors. The device includes a plurality of forward voltage detection circuits, each of which detects forward voltage of one of the thyristors and generates a forward voltage signal based on the detected forward voltage, respectively. The device includes a first circuit for generating a conduction command signal which commands the thyristor converter to conduct, and a second circuit for generating a plurality of light gate signals and a gate monitoring signal based on a plurality of modified forward voltage signals and the conduction command signal. Each of the light gate signals is applied to one of the thyristors to turn ON thereof, respectively. The device includes a first delay circuit connected to receive the gate monitoring signal for delaying the gate monitoring signal by a first predetermined time to produce a first delayed signal. The device further includes a processing circuit connected to receive the first delayed signal and a plurality of the forward voltage signals for detecting whether or not any of the plurality of forward voltage detection circuits is in a failure, for distinguishing the forward voltage detection circuit in a failure and for generating a plurality of the modified forward voltage signals based on the result of the failure detection and the distinction, thereby inhibiting the forward voltage signal of the forward voltage detection circuit in a failure from transmitting to said second circuit.

11 Claims, 4 Drawing Sheets

CONTROL DEVICE FOR THYRISTOR CONVERTER

This application is a Continuation of application Ser. No. 08/053,404, filed on Apr. 28, 1993, now abandoned.

BACKGROUND OF THE INVENTION

1. Field of the Invention

This invention relates to a device for controlling a thyristor converter used in, for example, a high voltage DC transmission system.

2. Description of the Related Art

Conventionally, as a method for firing thyristors connected in series or in series-parallel in a thyristor converter by a light signal with a narrow pulse width, such method has been used as a gate command is generated when the logic AND condition of a conduction command signal for commanding the conduction duration of the thyristor converter and the forward voltage signal of the thyristors in the thyristor converter is realized.

Hereinafter an operation will be described of a conventional control device for a thyristor converter. FIG. 4 shows a block diagram of a conventional control device for a thyristor converter. In FIG. 4, a plurality of light-triggered thyristors 1-1 through 1-N are connected in series. In parallel to each of the thyristors, a voltage dividing circuit 2 and one of a forward voltage detection circuit 6-1 through 6-N are connected. The circuit 2 consists of a capacitor and resistors. Each of the circuits 6-1 through 6-N consists of a light emitting diode 3, a resistor 4 connected in series to the diode 3 and a diode 5 connected in anti-parallel to the diode 3, respectively. Each of the circuits 6-1 through 6-N detects a forward voltage of one of the thyristors 1-1 through 1-N and generates an optical forward voltage signal, respectively. Each of the forward voltage signals is transmitted to one of light-electricity conversion circuits 8-1 through 8-N via one of light guides 7-1 through 7-N, and is converted to one of electrical forward voltage signals a-1 through a-N therein, respectively. The signals a-1 through a-N are applied to an OR circuit 9 which generates a forward voltage OR signal b.

A conduction command signal c which commands the conduction duration of the thyristor converter and the forward voltage OR signal b are applied to an AND circuit 10 which generates a gate signal d. The gate signal d is applied to a pulse circuit 11 and to one input of an OR circuit 12. The pulse circuit 11 is a monostable multivibrator which produces a pulse signal with a pulse width T1, for example, 50 microseconds. The output signal of the pulse circuit 11 is applied to the other input of the OR circuit 12. The output signal of the OR circuit 12 is applied to an amplifier circuit 13 for driving series connected light emitting diodes 14-1 through 14-N and 14-M. Each of the light emitting diodes 14-1 through 14-N generates a light gate signal which is supplied to one of the thyristors 1-1 through 1-N, respectively. The light emitting diode 14-M provided for monitoring generates a light gate monitoring signal, which is converted into an electrical gate monitoring signal e in a light-electricity conversion circuit 15. The signal e is applied to a delay circuit 16 which detects whether or not the pulse width of the signal e is smaller than the time duration T2, for example, 1 millisecond.

In the normal operation of the thyristor converter, when the light gate signals are applied to the light-triggered thyristors 1-1 through 1-N, they will be fired and the forward voltage thereof will become to zero. Accordingly, the pulse width of the light gate signals is T1 as determined by the pulse circuit 11.

When one or more of the thyristors 1-1 through 1-N are not turned ON due to the imbalance of the voltage division among the thyristors 1-1 through 1-N, the pulse width of the forward voltage OR signal b is designed to be so large that all of the thyristors 1-1 through 1-N are fired.

In the above-described conventional control device for the thyristor converter, when one of the light-electricity converter units 8-1 through 8-N is in a failure such that the respective one of the forward voltage signals a-1 through a-N is generated continuously, the gate signal d is generated during the conduction command duration. Then the light gate pulse is generated during that time. When the time T2 lapses since the light gate pulse rises, it is designed that the output of the delay circuit 16 will be "1" thereby to stop the operation of the thyristor converter. The state that the light gate pulse is generated continuously is very dangerous for the thyristor converter, because the light emitting diodes 14-1 through 14-N are not designed to withstand continuous use, so that the operation thereof is to be stopped for repairing the failure portion.

Accordingly, the conventional control device has such a defect that if only one of the photoelectric conversion circuits 8-1 through 8-N for forward voltage detection (the number of the circuits is the same to that of the thyristors) is in a failure that the forward voltage signal is generated continuously, the light gate pulse is generated abnormally and the operation of the thyristor converter is to be stopped.

SUMMARY OF TEE INVENTION

Accordingly, one object of this invention is to provide a control device for the thyristor converter which can continue the operation of the thyristor converter without stopping the operation when the photoelectric conversion circuit for the forward voltage detection is in a failure that the forward voltage signal is generated continuously.

These and other objects of this invention can be achieved by providing a device for controlling a thyristor converter including series connected thyristors. The device includes a plurality of forward voltage detection circuits, each of which detects forward voltage of one of the thyristors and generates a forward voltage signal based on the detected forward voltage, respectively. The device includes a first circuit for generating a conduction command signal which commands the thyristor converter to conduct, and a second circuit for generating a plurality of light gate signals and a gate monitoring signal based on a plurality of modified forward voltage signals and the conduction command signal. Each of the light gate signals is applied to one of the thyristors to turn ON thereof, respectively. The device includes a first delay circuit connected to receive the gate monitoring signal for delaying the gate monitoring signal by a first predetermined time to produce a first delayed signal. The device further includes a processing circuit connected to receive the first delayed signal and a plurality of the forward voltage signals for detecting whether or not any of the plurality of forward voltage detection circuits is in a failure, for distinguishing the forward voltage detection circuit in a failure and for generating a plurality of the modified forward voltage signals based on the result of the failure detection and the distinction, thereby inhibiting the forward voltage signal of the forward voltage detection circuit in a failure from transmitting to said second circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
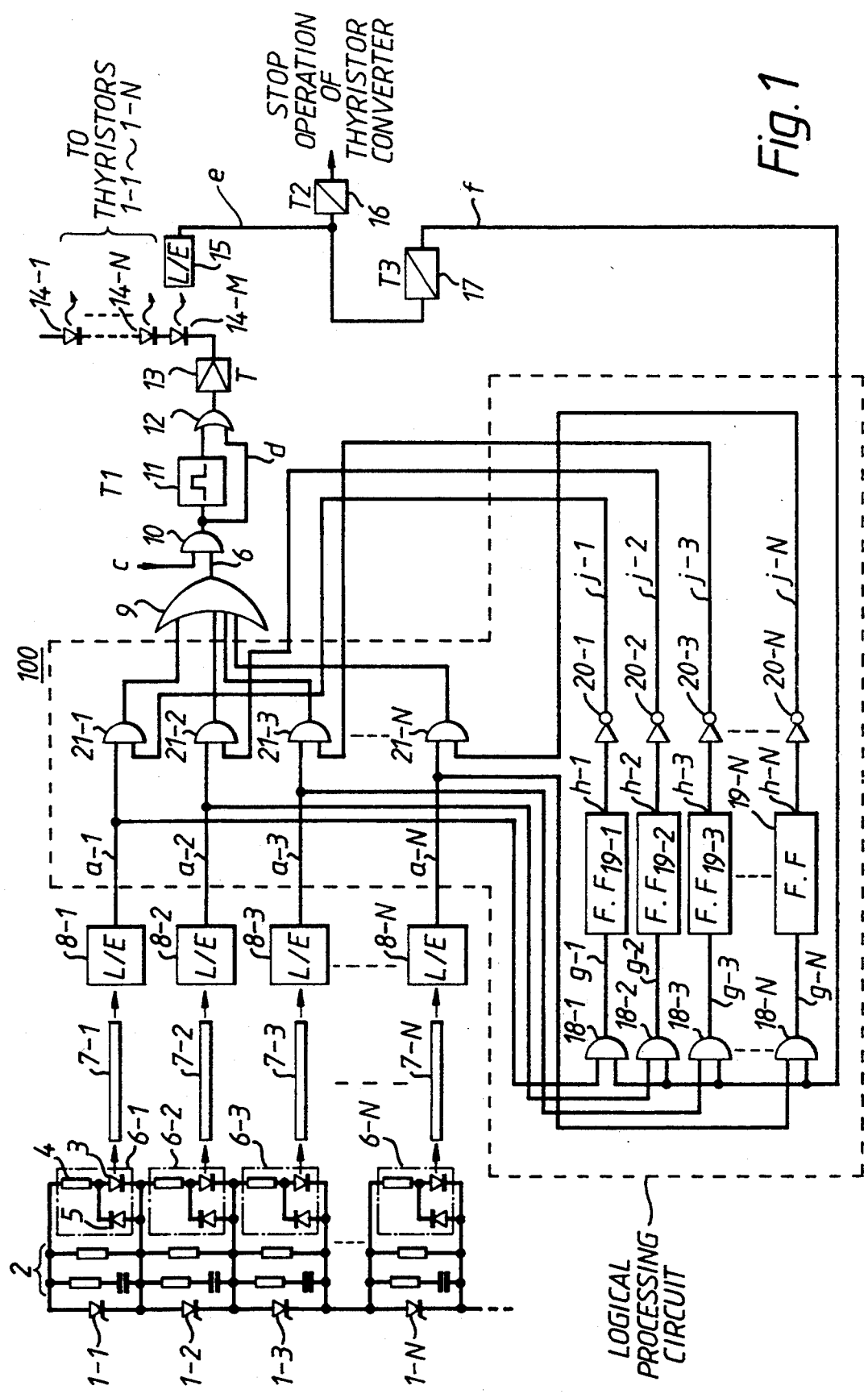
FIG. 1 is a block diagram showing a control device for the thyristor converter according to an embodiment of this invention.

Referring now to the drawings, wherein like reference numerals designate identical or corresponding parts throughout the several views, the embodiments of this invention will be described below.

Figure 4:
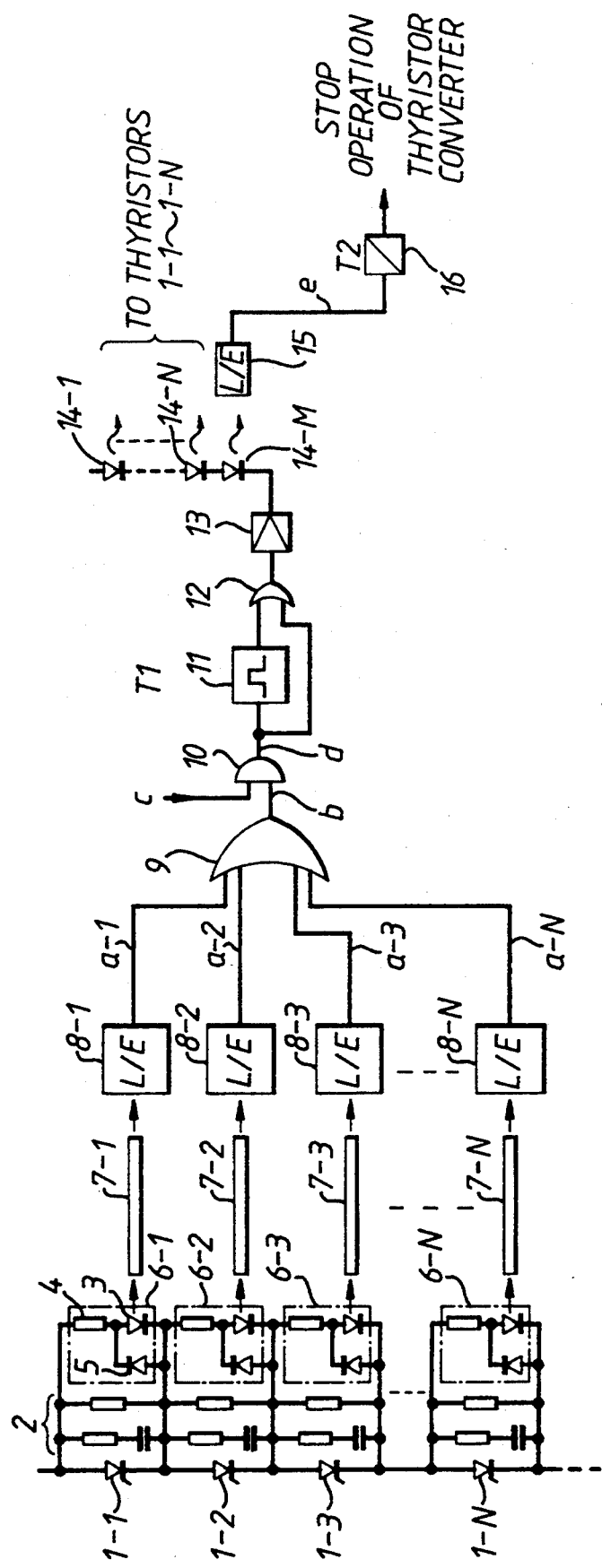
FIG. 4 is a block diagram showing a conventional control device for the thyristor converter.

FIG. 1 is a block diagram showing a control device for the thyristor converter according to an embodiment of this invention. The gate monitoring signal e is applied to a delay circuit 17 which generates a delayed signal f, the rise of which is behind the rise of the signal e by a delay time T3, for example, 800 microseconds. The delayed signal f and the forward voltage signals a-1 through a-N are applied to a logical processing circuit 100. The logical processing circuit 100 is constituted by AND circuits 18-1 through 18-N, flip flops 19-1 through 19-N, inverters 20-1 through 20-N and AND circuits 21-1 through 21-N. The delayed signal f and each of the forward voltage signals a-1 through a-N are applied to one of the AND circuits which generates output signals g-1 through g-N, respectively. Each of the flip flops 19-1 through 19-N are set by one of the output signals g-1 through g-N, respectively. Each of the Q output signals h-1 through h-N is applied to one of the inverters 20-1 through 20-N which generates inverted signals J-1 through j-N, respectively. Each of the inverted signals J-1 through j-N and each of the forward voltage signals a-1 through a-N are applied to one of the AND circuits 21-1 through 21-N, respectively. Output signals of the AND circuits 21-1 through 21-N are applied to the OR circuit 9 which generates the forward voltage OR signal b. The signal b and the conduction command signal c are applied to the AND circuit 10 as in the FIG. 4. The relation among the time T1, T2 and T3 are determined as T2>T3>T1.

Figure 2:
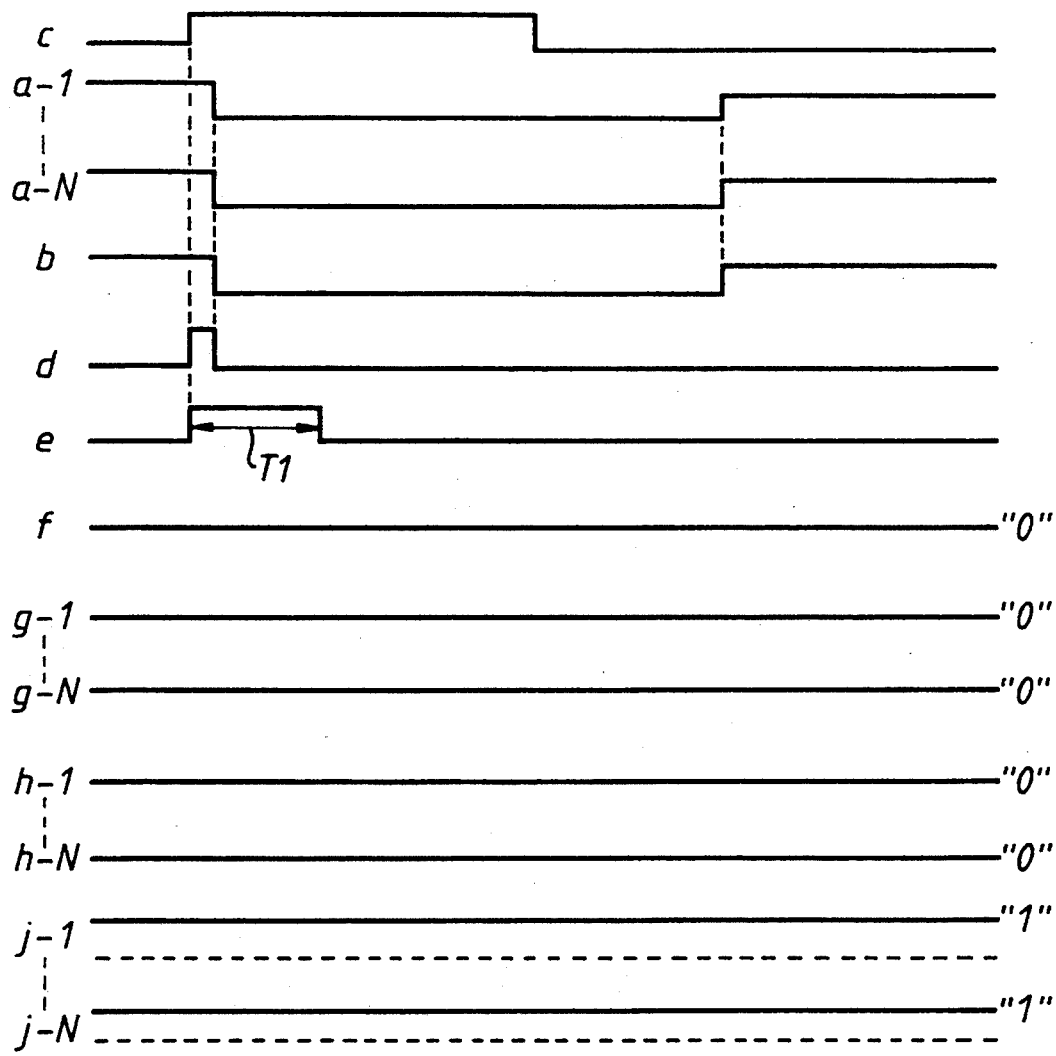
FIG. 2 is a timing chart showing a normal operation of the control device of FIG. 1.
Figure 3:
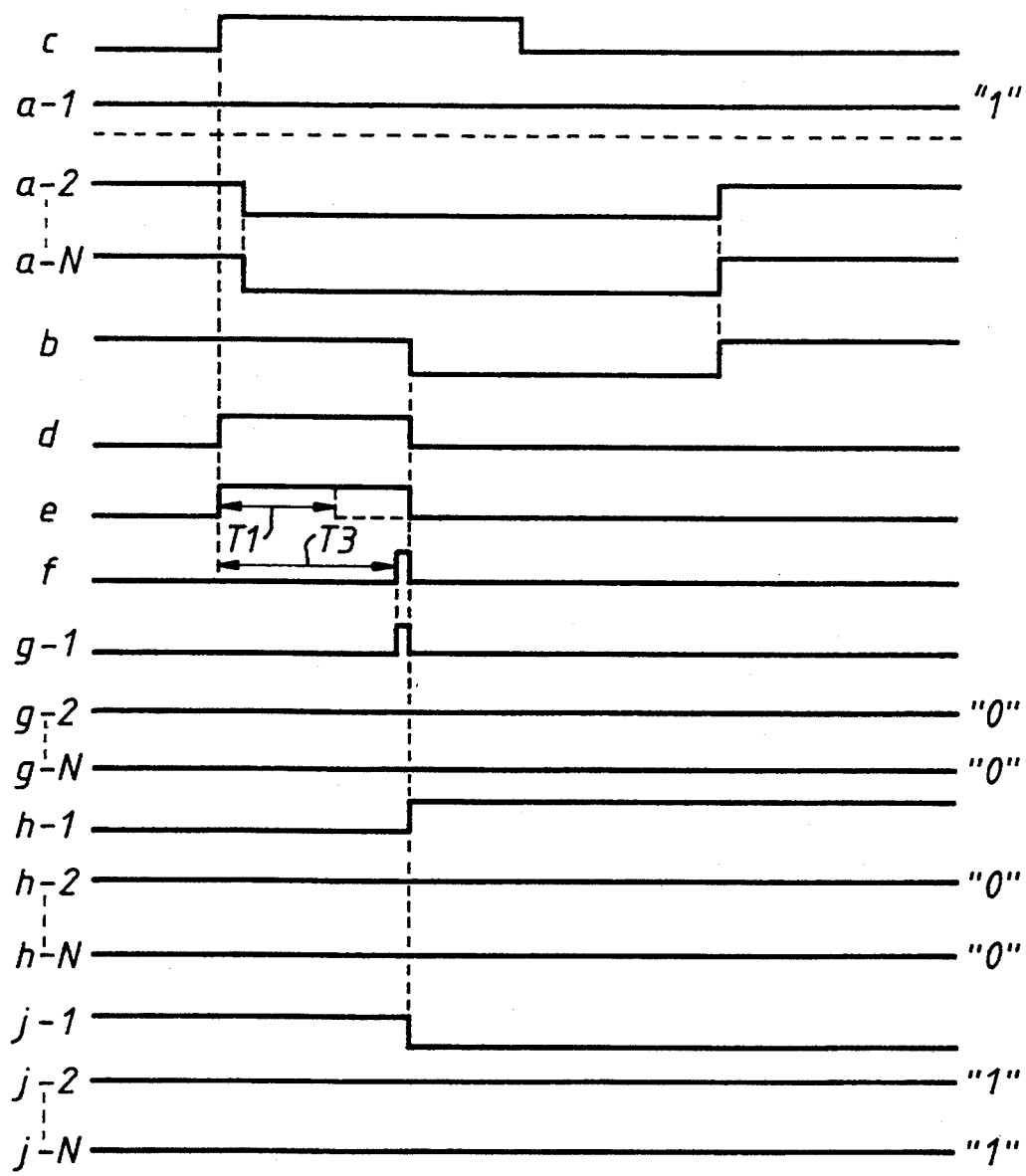
FIG. 3 is a timing chart showing an operation of the control device of FIG. 1 when the photoelectric conversion circuit for forward voltage detection is in a failure.

Hereinafter the operation of the control circuit shown in FIG. 1 will be described referring FIGS. 2 and 3. FIG. 2 shows timing chart of the normal operation. In FIG. 2, when each of the light gate signals from the light emitting diodes 14-1 through 14-N is applied to one of the gate of the light-triggered thyristors 1-1 through 1-N, one of them is turned ON and one of the forward voltage signals a-1 through a-N will be turned to the "0" state, respectively. As a result, the forward voltage OR signal b of the OR circuit 9 will be turned to the "0" state. The signal b turns to the "0" state several microseconds later than the rise of the conduction command signal c due to the time required to the operation of the circuit between the AND circuit 10 and the OR gate 9 through one of the light emitting diodes 14-1 through 14-N, one of the thyristors 1-1 through 1-N and one of the light-electricity conversion circuits 8-1 through 8-N and so on, respectively. The gate signal d of the AND gate 10 will be a pulse signal, the width of which is several microseconds corresponding to a time difference between the rise of the signal c and the fall of the signal b. The OR circuit 12 then produces a pulse signal with a pulse width of time T1. Based on the output signal of the OR circuit 12, the amplifier circuit 13 drives the light emitting diodes 14-1 through 14-N to produce the light gate signals with a pulse width of T1. The gate monitoring signal e from the light-electricity conversion circuit 16 will be a signal with a pulse width of T1. As it is designed such that T1 is smaller than T2, the output of the delay circuit 16 keeps "0" state and the operation of the thyristor converter is not stopped.

As it is designed such that T3 is larger than T1, the delayed signal f keeps "0" state. The output signals g-1 through g-N of the AND circuits 18-1 through 18-N keep "0" state, the flip flops 19-1 through 19-N are not set and the inverted signals j-1 through j-N of the inverters 20-1 through 20-N keeps "1" state. Accordingly, the thyristor converter continues its normal operation.

Next, an Operation of the control device of FIG. 1 when the light-electricity conversion circuit for forward voltage detection is in a failure. As an example where the light-electricity conversion circuit 8-1 is in a failure and the output signal a-1 keeps "1" state, the operation of the control device will be described referring to FIG. 3. In the normal operation, the inverted signals j-1 through j-N keep "1" state as described above referring to FIG. 2. And when the light-electricity conversion circuit 8-1 becomes in a failure and the forward voltage signal a-1 of the circuit 8-1 turns to keep "1" state, the forward voltage OR signal b keeps "1" state. The light gate pulses are applied to the photo-activated thyristors 1-1 through 1-N to let them turn ON. Though the forward voltage signals a-2 through a-N become "0" state, the signal a-1 keeps "1" state thereby to make the width of the light gate pulses wider.

When the pulse width of the gate monitoring signal e for the light gate signals becomes larger than the time T3, the output signal f of the delay circuit 17 becomes "1" state. As the forward voltage signal a-1 keeps "1" state, the AND circuit 18-1 generates the output signal g-1 of the "1" state, which sets the flip flop 19-1. Then the Q output signal h-1 becomes "1" state and the inverted signal j-1 of the inverter 20-1 becomes "0" state. Though the forward voltage signal a-1 keeps "1" state, when the inverted signal j-1 becomes "0" state the output signal of the AND circuit 21-1 becomes "0" state. In this time, as the other light-electricity conversion circuits 8-2 through 8-N are operating normally, the thyristors 1-2 through 1-N are in the ON state the forward voltage signals a-2 through a-N are "0" state. As the other inverted signals j-2 through j-N on the inverters 20-2 through 20-N keep "1" state, the output signals 21-2 through 21-N are all "0" state. So the forward voltage OR signal b of the OR circuit 9 becomes "0"

state, and then the gate signal d of the AND circuit 10 and the output signal of the OR circuit 12 turn to "0" state. Then the light gate signals 14-1 through 14-N are stopped to generate and the gate monitoring signal e becomes "0" state.

As it is designed that T2 is larger than T3, the delay circuit 16 does not generate "1" output and the thyristor converter does not stop, even though the light-electricity conversion circuit 8-1 is in a trouble.

When the gate monitoring signal e turns to "0" state, the output signal f of the delay circuit 17 and output signal of the AND circuit 18-1 turn to "0" state, accordingly. Though the signal f turns to "0" state, the Q output signal h-1 of the flip flop 19-1 keeps "1" state. The inverted signal j-1 keeps "0" state accordingly and the "0" state thereof inhibits the signal a-1 from transmitting to the OR circuit 9 thereafter at the AND circuit 21-1.

It goes without saying that if the gate monitoring signal e continues "1" state in longer time than T3 due to other failure cause the thyristor converter is stopped its operation by the output signal of the delay circuit 16 at the time when the signal e keeps "1" state for the time T2.

As described above, according to this invention, when the forward voltage detection circuit is in a failure that the forward voltage signal is generated continuously and accordingly the light gate signal is likely to generate in an abnormally long time, the delay circuit 17 and the logical processing circuit 100 inhibits the failed forward voltage signal from transmitting to the later stage of generating the light gate signal and keeps the thyristor converter to operate normally. Namely, the control device for the thyristor converter according to the invention can continue its operation when only the forward voltage detection circuit becomes in a failure.

Besides, the failure of the forward voltage detection circuit held in any of the flip flop circuits can be applied to a display device (not shown). So the failed circuit can be distinguished easily and it is convenient for the repair or change of the failed circuit.

In the above-described embodiment, the thyristors 1-1 through 1-N are connected is series in the thyristor converter, this invention can be applied to the thyristor converter where the thyristors are connected in series-parallel.

In the above-described embodiment, the forward voltage detection circuit is provided one for a single thyristor, but this invention can be applied to the thyristor converter where the forward voltage detection circuit is provided one for a group of a plurality of the thyristors.

In the above-described embodiment, the relation of the delay times is determined as T2>T3>T1. But this relation is not essential to this invention. This invention is applied to the control device where the relation of the delay times is determined as T2>T3 and T2>T1. As far as the time T3 is determined to be larger than the delay time of the thyristor, T1 can be determined to be larger than T3.

In the above-described embodiment the light emitting diodes 14-1 through 14-N are used to generate light gate signals. But this is not limited to this embodiments, laser diodes can be used instead of the light emitting diodes.

In the above-described embodiment, this invention is applied to the control device for the thyristor converter with the light-triggered thyristors. But this invention can also be applied to the control device for the thyristor converter constituted by the thyristors which are triggered by electic signals.

Obviously, numerous modifications and variations of the present invention are possible in light of the above teachings. It is therefore to be understood that within the scope of the appended claims, the invention may be practiced otherwise than as specifically described herein.

What is claimed is:

1. A device for controlling a thyristor converter including a plurality of connected thyristors, said device comprising:

a plurality of forward voltage detection means, each for detecting a forward voltage of one of said thyristors and for generating a forward voltage signal based on the detected forward voltage, respectively;

first means for generating a conduction command signal which commands said thyristor converter to conduct;

second means for generating a plurality of light gate signals and a gate monitoring signal based on a plurality of modified forward voltage signals and said conduction command signal, each of said light gate signals being applied to one of said thyristors to turn ON thereof, respectively;

delay circuit means connected to receive said gate monitoring signal for delaying said gate monitoring signal by a first predetermined time to produce a delayed signal; and processing means connected to receive said delayed signal and a plurality of said forward voltage signals for detecting whether or not any of said plurality of forward voltage detection means is in a failure, for distinguishing said forward voltage detection means in a failure and for generating a plurality of said modified forward voltage signals based on the result of the failure detection and the distinction, said modified forward voltage signal being applied to said second means, thereby inhibiting said forward voltage signal of said forward voltage detection means in a failure from transmitting to said second means.

2. The device according to claim 1, wherein said processing means comprises:

a plurality of first AND circuit means, each of which being connected to receive said delayed signal and one of said forward voltage signals as two inputs and for generating a first AND output signal, respectively;

a plurality of flip flop means, each of which being connected to receive one of said first AND output signals and being set by one of said first AND output signals, respectively;

a plurality of inverter means, each of which being connected to a respective Q output of said flip flop means as an input and for inverting said Q output to produce an inverted signal, respectively; and a plurality of second AND circuit means, each of which being connected to receive one of said inverted signals and one of said forward voltage signals as two inputs and for generating a second AND output signal, respectively; and wherein said second AND output signals are applied to said second means as said modified forward voltage signals.

3. The device according to claim 2, wherein said second means comprises:
  first OR circuit means connected to receive said second AND output signals as said modified forward voltage signals, for generating a forward voltage OR signal;
  third AND circuit means connected to receive said forward voltage OR signal and said conduction command signal as two inputs, for generating a third AND output signal;
  monostable multivibrator means connected to receive said third AND output signal for generating a one shot pulse signal, a pulse width of which being a second predetermined time;
  second OR circuit means connected to receive said one shot pulse signal and said third AND output signal as two inputs for generating a second OR output signal; and
  light gate signal generating means connected to receive said second OR output signal for generating a plurality of said light gate signals and said gate monitoring signal.

4. The device according to claim 3, further comprising:
  monitor circuit means connected to receive said gate monitoring signal for generating a monitor signal when a pulse width of said gate monitoring signal is larger than a third predetermined time, said monitor signal being used for stopping operation of said thyristor converter.

5. The device according to claim 4, wherein said third predetermined time is larger than said first predetermined time and said second predetermined time.

6. The device according to claim 1, wherein said plurality of thyristors are light-triggered thyristors.

7. The device according to claim 1, wherein said plurality of thyristors are connected in series.

8. The device according to claim 1, wherein each of said forward voltage detection means is provided one for a group of said thyristors, respectively.

9. The device according to claim 4, wherein said light gate signal generating means comprises:

amplifier circuit means connected to receive said second OR output signal for amplifying said second OR output signal;
  a plurality of light emitting diodes connected to said amplifier circuit means for generating a plurality of said light gate signals and a light gate monitoring signal; and
  light-electricity conversion means for converting said light gate monitoring signal into said gate monitoring signal.

10. The device according to claim 1, wherein said processing means includes:
  a plurality of processing circuits, each of which being connected to receive said delayed signal and one of said forward voltage signals as two inputs, for detecting whether or not one of said forward voltage detecting means is in a failure, for distinguishing said forward voltage detection means in a failure and for generating one of said modified forward voltage signals based on the result of the failure detection and the distinction, respectively.

11. The device according to claim 10, wherein said plurality of processing circuits comprise:
  a plurality of first AND circuit means, each of which being connected to receive said delayed signal and one of said forward voltage signals as two inputs and for generating a first AND output signal, respectively;
  a plurality of flip flop means, each of which being connected to receive one of said first AND output signals and being set by one of said first AND output signals, respectively;
  a plurality of inverter means, each of which being connected to a respective Q output of said flip flop means as an input and for inverting said Q output to produce an inverted signal, respectively; and
  a plurality of second AND circuit means, each of which being connected to receive one of said inverted signals and one of said forward voltage signals as two inputs and for generating a second AND output signal, respectively; and
  wherein said second AND output signals are applied to said second means as said modified forward voltage signals.

* * * * *